(12) United States Patent
Avoyan et al.

(10) Patent No.: US 9,505,036 B2
(45) Date of Patent: Nov. 29, 2016

(54) PORTABLE SONIC PARTICLE REMOVAL TOOL WITH A CHEMICALLY CONTROLLED WORKING FLUID

(71) Applicant: Lam Research Corporation, Fremont, CA (US)

(72) Inventors: Armen Avoyan, Glendale, CA (US); Cliff LaCroix, Livermore, CA (US); Hong Shih, Walnut, CA (US); John Daugherty, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 768 days.

(21) Appl. No.: 13/833,487

(22) Filed: Mar. 15, 2013

(65) Prior Publication Data

US 2014/0261575 A1    Sep. 18, 2014

(51) Int. Cl.
  *B08B 3/12*     (2006.01)
  *C11D 11/00*    (2006.01)
  *H01L 21/67*    (2006.01)

(52) U.S. Cl.
  CPC ............... *B08B 3/12* (2013.01); *C11D 11/007* (2013.01); *C11D 11/0041* (2013.01); *C11D 11/0047* (2013.01); *H01L 21/67017* (2013.01); *H01L 21/67051* (2013.01)

(58) Field of Classification Search
  CPC . B08B 3/12; C11D 11/0041; C11D 11/0047; C11D 11/007; H01L 21/67017; H01L 21/67051
  USPC ............................... 134/1, 1.3, 36, 99.1, 105
  See application file for complete search history.

(56) References Cited

U.S. PATENT DOCUMENTS

| 4,893,320 A | 1/1990 | Yanagi et al. | |
| 2004/0134513 A1* | 7/2004 | Lu | B08B 3/12 134/1 |
| 2005/0061355 A1* | 3/2005 | Berman | B08B 3/12 134/1.3 |

\* cited by examiner

*Primary Examiner* — Michael Barr
*Assistant Examiner* — Levon J Shahinian
(74) *Attorney, Agent, or Firm* — Beyer Law Group LLP

(57) ABSTRACT

A particle removal tool having a sound field transducer, a cleaning chamber, and an open sealing face. The cleaning chamber having a cleaning fluid guiding chamber extending from the sound field transducer to the open sealing face, a cleaning fluid delivery channel in fluid communication with the cleaning fluid guiding chamber, and a cleaning fluid return channel. The open sealing face has a cleaning portal disposed contiguous with a plane formed by the open sealing face and a chamber-to-surface interface seal which forms a fluid tight seal with a cleaning surface plane. The sound field transducer is disposed within a line-of-sight of the cleaning portal and generates acoustic waves with a frequency between approximately 20 kHz and approximately 2 MHz.

19 Claims, 4 Drawing Sheets

PORTABLE SONIC PARTICLE REMOVAL TOOL WITH A CHEMICALLY CONTROLLED WORKING FLUID

BACKGROUND

The present disclosure relates to a system and method of removing particles for analysis or cleaning from surfaces.

Processing of substrates, such as semiconductor wafers, may include a variety of operations. One such operation is etching the substrate for example. Processing of semiconductor wafers and other substrates requires an environment clean from foreign debris and contaminants. The presence of contaminants would potentially yield unacceptable work product. The nature of semiconductor wafer processing equipment is not conducive to cleaning in situ and traditionally requires machine disassembly and placement of individual components in a separate cleaning machine or tank. The present inventors have recognized a need for alternatives to the aforementioned cleaning process and, more particularly, in situ cleaning of processing equipment parts.

BRIEF SUMMARY

According to the subject matter of the present disclosure, a particle removal tool is provided to remove particles from a surface. The particle removal tool is intended to remove particles, for example quartz, alumina and yttria particles, from the surface of semiconductor wafer processing equipment. The particle removal tool may serve to remove particles from defined surface areas without traditional submersion in an ultrasonic cleaning tank.

In accordance with one embodiment of the present disclosure, a particle removal tool comprises a sound field transducer, a cleaning chamber, and an open sealing face. The cleaning chamber comprises a cleaning fluid guiding chamber extending from the sound field transducer to the open sealing face, a cleaning fluid delivery channel in fluid communication with the cleaning fluid guiding chamber, and a cleaning fluid return channel with higher flow resistance than the cleaning fluid delivery channel and in fluid communication with the cleaning fluid guiding chamber. The open sealing face has a cleaning portal disposed contiguous with a plane formed by the open sealing face. The sound field transducer is disposed within a line-of-sight of the cleaning portal and generates acoustic waves with a frequency between approximately 20 kHz and approximately 2 MHz. The open sealing face comprises a chamber-to-surface interface seal which forms a fluid tight seal with a cleaning surface plane when the particle removal tool is compressed against the cleaning surface plane.

In accordance with another embodiment of the present disclosure, a particle removal tool comprises a sound field transducer, a cleaning chamber, an open sealing face, and a liquid particle counter. The cleaning chamber comprises a cleaning fluid guiding chamber extending from the sound field transducer to the open sealing face, a cleaning fluid delivery channel in fluid communication with the cleaning fluid guiding chamber, a deionized water feed stream and a chemical solution feed stream, and a cleaning fluid return channel with higher flow resistance than the cleaning fluid delivery channel and in fluid communication with the cleaning fluid guiding chamber. The open sealing face comprises a cleaning portal disposed contiguous with a plane formed by the open sealing face. The sound field transducer is disposed within a line-of-sight of the cleaning portal and generates acoustic waves with a frequency between approximately 20 kHz and approximately 2 MHz. The open sealing face is disposed on an outwardly extending flange of the cleaning fluid guiding chamber and comprises a chamber-to-surface interface seal which forms a fluid tight seal with a cleaning surface plane when the particle removal tool is compressed against the cleaning surface plane. The chamber-to-surface interface seal is an O-ring type seal. The liquid particle counter is in fluid communication with the cleaning fluid return channel.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
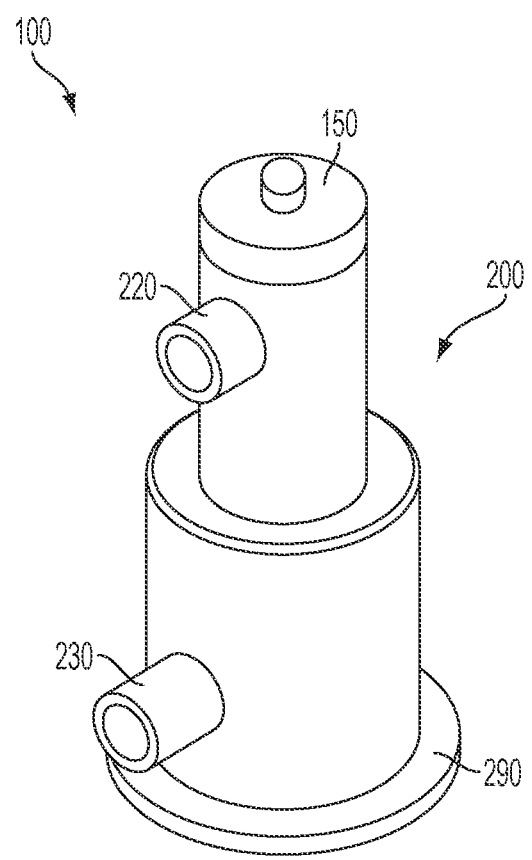
FIG. 1 is an isometric view of a particle removal tool according to one embodiment of the present disclosure.
Figure 2:
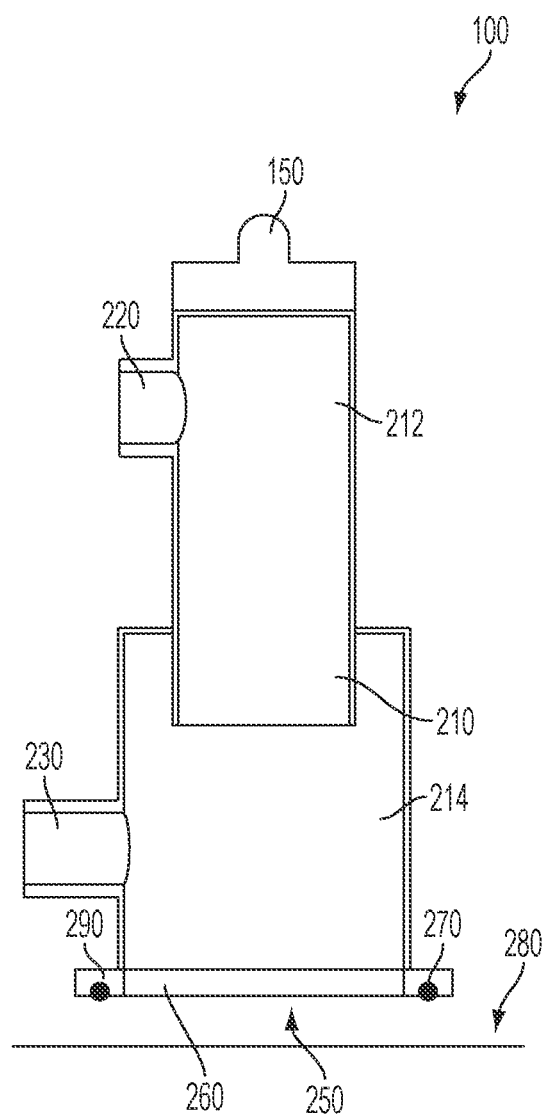
FIG. 2 is a cut side view of a particle removal tool according to one embodiment of the present disclosure.

Referring to the drawings in general and to FIGS. 1 and 2 in particular, it will be understood that the illustrations are for the purpose of describing a particular embodiment of the present disclosure and are not intended to limit the scope of the appended claims. A particle removal tool 100 comprises a sound field transducer 150, a cleaning chamber 200, and an open sealing face 250. The cleaning chamber 200 comprises a cleaning fluid guiding chamber 210 extending from the sound field transducer 150 to the open sealing face 250. The cleaning chamber 200 further comprises a cleaning fluid delivery channel 220 in fluid communication with the cleaning fluid guiding chamber 210, and a cleaning fluid return channel 230 with higher flow resistance than the cleaning fluid delivery channel 220 and in fluid communication with the cleaning fluid guiding chamber 210. The open sealing face 250 comprises a cleaning portal 260 disposed contiguous with a plane formed by the open sealing face. The sound field transducer 150 is disposed within a line-of-sight of the cleaning portal 260 and generates acoustic waves with a frequency between approximately 20 kHz and approximately 2 MHz. The open sealing face 250 comprises a chamber-to-surface interface seal 270 which forms a fluid tight seal with a cleaning surface plane 280 when the particle removal tool 100 is compressed against the cleaning surface plane.

The particle removal tool 100 provides portable sonic cleaning. Cleaning fluid is introduced into the cleaning chamber 200 through the cleaning fluid delivery channel 220. The cleaning fluid passes through the cleaning chamber 200 and exits through the cleaning fluid return channel 230. Prior to exiting the cleaning chamber 200, the cleaning fluid passes across a cleaning surface plane 280. Sonic waves, for example in the ultrasonic or megasonic range, are produced by the sound field transducer 150. The sonic waves in conjunction with the cleaning fluid provide a cleaning action on the cleaning surface plane 280. The flow of the cleaning fluid out through the cleaning fluid return channel 230 carries removed particles or contaminants from the cleaning surface plane 280 away from the cleaning chamber 200. The chamber-to-surface interface seal forms a fluid tight connection between the cleaning chamber 200 and the cleaning surface plane 280 to ensure the cleaning fluid is retained in the cleaning chamber before passing out through the cleaning fluid return channel 230.

In an embodiment, the cleaning fluid guiding chamber 210 comprises an inlet chamber 212 and a return chamber 214. The inlet chamber 212 is proximate the cleaning fluid delivery channel 220. The return chamber 214 is proximate the cleaning fluid return channel 230. FIGS. 1 and 2 show the inlet chamber 212 and return chamber 214 as right circular cylinders with the inlet chamber having a smaller cross sectional area than the return chamber 214. However, other embodiments are envisioned including rectilinear cross-sections or non-circular curvilinear cross-sections. In an embodiment the interior cross-section of the cleaning fluid guiding chamber 210 is consistent along the entire length with the inlet chamber 212 and the return chamber 214 having substantially identical interior cross-sections.

In an embodiment, as shown in FIG. 2, the inlet chamber 212 has a smaller cross-sectional area than the return chamber 214. The inlet chamber 212 extends into the return chamber 214. The inlet chamber 212 is envisioned extending into the return chamber 214 from 0% to at least 95% of the length of the return chamber. The extension of the inlet chamber 212 into the volume of the return chamber 214 effects the flow pattern of cleaning fluid introduced into the cleaning fluid guiding chamber 210. Without wishing to be bound by theory, it is believed that extension of the inlet chamber 212 into the return chamber 214 results in the cleaning fluid being directed toward the cleaning surface plane 280, toward the outer walls of the return chamber, and out the cleaning fluid return channel 230 in a smooth flow pattern. The flow of the cleaning fluid carries removed particles out the cleaning fluid return channel 230 for removal and/or analysis.

The open sealing face 250 comprises a chamber-to-surface interface seal 270 which forms a fluid tight seal with the cleaning surface plane 280 when the particle removal tool 100 is compressed against the cleaning surface plane. In an embodiment the chamber-to-surface interface seal 270 is an O-ring type seal. The compression of the particle removal tool 100 against the cleaning surface plane 280 results in deflection of the O-ring type chamber-to-surface interface seal 270 to form a fluid tight seal between the particle removal tool and the cleaning surface plane. In another embodiment the chamber-to-surface interface seal 270 is a flange type seal. The compression of the particle removal tool 100 against the cleaning surface plane 280 results in compression of the flange type chamber-to-surface interface seal 270 against the cleaning surface plane to form a fluid tight seal between the particle removal tool and the cleaning surface plane.

Referring to FIGS. 1 and 2, an embodiment of the particle removal tool 100 is shown. The open sealing face 250 is disposed on an outwardly extending flange 290 of the cleaning fluid guiding chamber 210. It is also envisioned that the open sealing face 250 is disposed on an inwardly extending flange (not shown) of the cleaning fluid guiding chamber 210.

The open sealing face 250 comprises a cleaning portal 260 disposed contiguous with a plane formed by the open sealing face. The end of the cleaning fluid guiding chamber 210 proximal the cleaning fluid return channel 230 is open. The open end of the cleaning fluid guiding chamber 210 is the cleaning portal 260. In an embodiment the cleaning portal 260 extends completely to the walls of the cleaning fluid guiding chamber 210, more specifically the return chamber 214, and has a profile matching the cross-sectional profile of the return chamber. In another embodiment, the cleaning portal 260 terminates prior to the walls of the cleaning fluid guiding chamber 210, more specifically the return chamber 214, leaving a portion of the endwall of the cleaning fluid guiding chamber 210 intact.

Compression of the particle removal tool 100 against the cleaning surface plane 280 helps ensure the chamber-to-surface interface seal is fluid tight. In an embodiment compression is achieved with a manual compressive force from the operator of the particle removal tool 100. In another embodiment, the particle removal tool 100 is compressed against the cleaning surface plane 280 with a clamp or other similar retainer. For example, the clamp may engage the outwardly extending flange 290 to supply a compressive force between the cleaning surface plane 280 and the particle removal tool 100.

Sonic cleaning operations are commonly undertaken by submerging parts to be cleaned into a cleaning tank. A stationary tank limits and impedes the ability to clean certain devices which are either large and bulky or difficult to disassemble. The portable nature of the particle removal tool 100 allows the cleaning operation to be brought to the desired surface to clean. This is in contrast to requiring the surface to be cleaned to be moved to the cleaning operation.

The sound field transducer 150 generates acoustic waves. The acoustic waves generated by the sound field transducer 150 create cavitation pockets at the cleaning surface plane 280 which assist in dislodging particles from the cleaning surface plane. Ultrasonic cleaning and megasonic cleaning uses cavitation bubbles induced by high frequency pressure waves induced by the sound waves to agitate a liquid. In a cleaning operation, cavitation is the process in which a bubble in a fluid is forced to oscillate in size or shape due to the energy input from the sound field transducer 150. The cavitation bubbles produce high forces on contaminants or particles adhering to the cleaning surface plane 280 for example. The cleaning action also penetrates blind holes, cracks, and recesses.

In an embodiment the sound field transducer 150 is positioned to abut the endwall of the cleaning chamber 200 proximate the cleaning fluid delivery channel 220. This portion of the cleaning chamber 200 is the inlet chamber 212. The sound field transducer 150 abuts the endwall of the inlet chamber 212 such that acoustic energy is transferred from the sound field transducer to the end wall of the inlet chamber. In another embodiment, the endwall of the inlet chamber 212 is removed and the sound field transducer 150 is positioned in direct contact with the interior volume of the cleaning chamber 200.

The frequency of the acoustic waves generated by the sound field transducer 150 affects the characteristics of the particles optimized for removal. The frequency has an effect on particle removal of particles of varying sizes. As a general rule lower frequencies tend to remove larger particles and higher frequencies tend to be the optimum frequency for smaller particles. The particle removal tool 100 may be fitted with a sound field transducer 150 which generates any specific desired frequency allowing for the particle removal tool to be adapted for various different particles with differing optimum removal frequencies. In an embodiment the sound field transducer 150 comprises an ultrasonic transducer and generates acoustic waves with a frequency between approximately 20 kHz and approximately 50 kHz. Non-limiting examples of acoustic wave frequencies are a frequency of approximately 20 kHz, approximately 30 kHz, or approximately 40 kHz. In another embodiment the sound field transducer 150 comprises a megasonic transducer and generates acoustic waves with a frequency between approximately 0.8 MHz and approximately 1.2 MHz. A non-limiting example of an acoustic wave frequency generated by the sound field transducer 150 is a frequency of approximately 1 MHz. In an embodiment, the sound field transducer 150 is capable of generating swept frequencies such that the sound field transducer outputs varying acoustic wave frequencies. Additionally, a sound field transducer 150 which generates at least two distinct frequencies is envisioned.

In an embodiment, the sound field transducer 150 is removable and capable of being replaced with at least a second sound field transducer. The ability to swap a sound field transducer 150 for a second sound field transducer allows for different acoustic wave frequencies to be generated from a single particle removal tool 100. For example, an initial cleaning operation can be undertaken using a sound field transducer 150 generating acoustic waves at approximately 40 kHz and then the sound field transducer is exchanged and a second cleaning operation is undertaken with acoustic waves at approximately 1 MHz. A single particle removal tool 100 is capable of removing a variety of particles in coordination with sound field transducers 150 of differing frequency set points. Additionally, a replaceable sound field transducer 150 reduces maintenance costs by allowing for replacement of only the sound field transducer in the event of a failure, opposed to the entire cleaning chamber 200 and sound field transducer combination.

Figure 3:
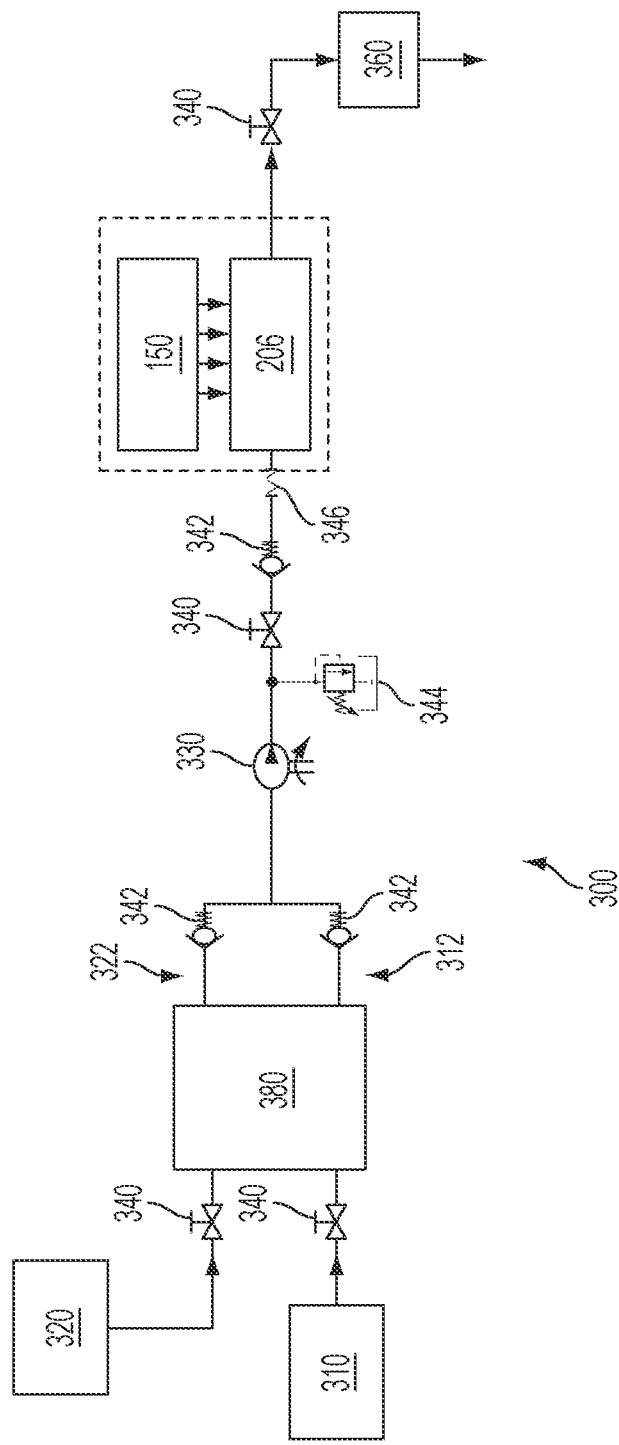
FIG. 3 is a schematic of a particle removal tool according to one embodiment of the present disclosure.
Figure 4:
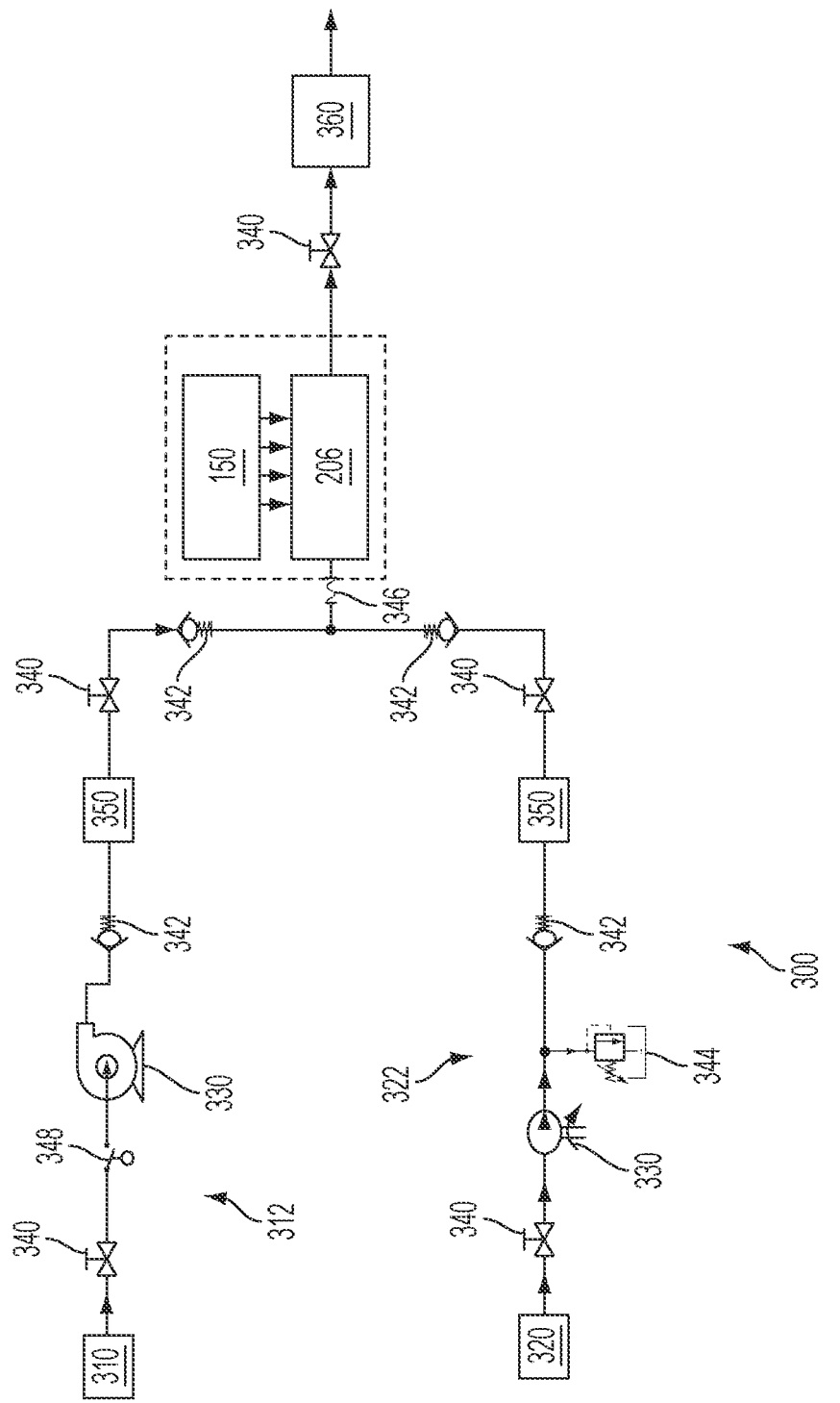
FIG. 4 is a schematic of a particle removal tool according to one embodiment of the present disclosure.

Referring to FIGS. 3 and 4, in an embodiment, the particle removal tool 100 comprises a cleaning fluid supply 300 containing a cleaning fluid. The cleaning fluid supply 300 provides a cleaning fluid to the cleaning chamber 200. In an embodiment, the cleaning fluid comprises deionized water. The deionized water is sourced from a deionized water supply 310. In an embodiment, the deionized water supply 310 is a tank or similar reservoir. In a further embodiment, the deionized water supply 310 is a continuous source capable of delivering a stream of undefined volume. A non-limiting example of a continuous source is on-demand deionized water generation.

In an embodiment, the cleaning fluid comprises a chemical solution. The chemical solution, in an embodiment, comprises a surfactant, an acid, and an oxidizing agent. In another embodiment the chemical solution comprises a surfactant, a base, and an oxidizing agent. The chemical solution is sourced from a chemical supply 320. In an embodiment, the chemical supply 320 is a tank or similar reservoir. In a further embodiment, the chemical supply 320 is a continuous source capable of delivering a stream of undefined volume. A non-limiting example of a continuous source is batch chemical solution generation to replace depletion from a demand buffering vessel.

In an embodiment the chemical solution in the chemical supply 320 is SC1. SC1, Standard Clean 1, is an industry accepted standard alkaline cleaning solution. The classic formulation is $NH_4OH$ (Ammonium Hydroxide), $H_2O_2$ (Hydrogen Peroxide, and dionized water at a ratio of 1:1:5. In an embodiment the SC1 is utilized at the standard formulation. In another embodiment the SC1 is utilized in a dilute formulation with the ratio of dionized water higher.

In an embodiment the chemical solution in the chemical supply 320 is SC2. SC2, Standard Clean 2, is an industry accepted standard etching and cleaning solution. The classic formulation is HCl (Hydrochloric Acid), $H_2O_2$ (Hydrogen Peroxide, and dionized water at a ratio of 1:1:5. In an embodiment the SC2 is utilized at the standard formulation. In another embodiment the SC2 is utilized in a dilute formulation with the ratio of dionized water higher.

In an embodiment surfactants are included in the chemical solution. Non-limiting examples of acceptable surfactants include alkyl phenoxy polyethylene oxide alcohol, for example NCW 601A (Wako Chemicals) and Triton X-100 (Union Carbide); alkyl phenoxy polyglycidols, for example Olin Hunt Surfactants (OHSR); fluorinated alkyl sulfonates, for example Flourad FC-93 (3M); acetylenic alcohols, for example Surfynol (APCI); and betaines, for example cocoamidopropyl betaine.

In an embodiment, the cleaning fluid supply 300 includes at least one cleaning fluid delivery pump 330. The cleaning fluid delivery pump 330 provides the motive force to transport the cleaning fluid from the deionized water supply 310, the chemical supply 320, or both to the cleaning fluid delivery channel 220 of the cleaning chamber 200. Non-limiting examples of cleaning fluid delivery pumps 330 include centrifugal pumps and peristaltic pumps. It is understood and envisioned that any method of imparting a motive force to a fluid in a pipe known to one skilled in the art may be used.

Referring to FIG. 3, in an embodiment of the particle removal tool 100, streams from the deionized water supply 310 and the chemical supply 320 are combined prior to reaching the cleaning fluid delivery pump 330. The respective flow rates of deionized water from the deionized water supply 310 and chemical solution from the chemical supply 320 can be controlled by adjusting flow valves 340 or control valves 342 disposed prior to the cleaning fluid delivery pump 330. Additionally, flow valve 340 or control valve 342 disposed subsequent to the cleaning fluid delivery pump 330 can also be utilized to adjust the total flow rate of the cleaning fluid.

Referring to FIG. 4, in an embodiment of the particle removal tool 100, streams from the deionized water supply 310 and the chemical supply 320 are combined subsequent to the at least one cleaning fluid delivery pump 330. Specifically, the deionized water feed stream 312 and the chemical solution feed stream 322 each include a cleaning fluid delivery pump 330 to provide a motive force for each respective fluid. The flow rates of deionized water from the deionized water supply 310 and chemical solution from the chemical supply 320 can be controlled by adjusting the flow rates of the cleaning fluid delivery pumps 330, adjusting flow valves 340 disposed prior to the cleaning fluid delivery pumps, or adjusting flow valves disposed subsequent to the cleaning fluid delivery pumps. Additionally, flow valves 340 or control valves 342 disposed subsequent to the cleaning fluid delivery pumps 330 can also be utilized to adjust the total flow rate of the cleaning fluid or the individual flow rates of streams from the deionized water supply 310 and the chemical supply 320.

In an embodiment float valve 348 controls the flow of deionized water from the deionized water supply 320. The float valve 348 maintains a desirable minimal level of deionized water in an intermediate deionized water storage tank (not shown). The float valve 348 ensures an adequate supply of deionized water is readily available to the cleaning fluid delivery pump 330 for transport to the cleaning chamber 200 and modulates undulations in the flow rate from the deionized water supply 320. It is explicitly noted that in an embodiment the float valve 348 is not utilized and control valves 342 are utilized for flow rate control.

In an embodiment, the deionized water feed stream 312 and the chemical solution feed stream 322 are both in fluid communication with the cleaning fluid delivery channel 220 of the cleaning chamber 200. The mixed streams from the deionized water feed stream 312 and the chemical solution feed stream 322 are introduced into the cleaning chamber 200. In an embodiment, the connection between the mixed streams from the deionized water feed stream 312 and the chemical solution feed stream 322 and the cleaning chamber 200 is a flexible hose 346. The flexible hose 346 provides freedom of motion of the cleaning chamber 200 and allows portability of the particle removal tool 100.

The independently controlled flow characteristics of the deionized water feed stream 312 and the chemical solution feed stream 322 allows for the ratio of deionized water and chemical solution in the cleaning fluid to adjusted. In an embodiment the cleaning fluid is preferably provided at the cleaning fluid delivery channel 220 at a pH between approximately 2 and approximately 12. The cleaning fluid is more preferably provided at the cleaning fluid delivery channel 220 at a pH between approximately 3 and approximately 4 for acidic applications and at a pH between approximately 10 and approximately 11 for basic applications. The increased cleaning fluid pH lowers the attractive force between the particle and the cleaning surface plane 280 to ease particle removal.

Referring again to FIGS. 3 and 4, in embodiments, the particle removal tool 100 further comprises at least one thermal control unit 350 to adjust the temperature of the cleaning fluid. It is envisioned that the thermal control unit 350 may increase the temperature of the cleaning fluid or may decrease the temperature of the cleaning fluid. In an embodiment, a single thermal control unit 350 is utilized with both the deionized water feed stream 312 and the chemical solution feed stream 322 passing through the single thermal control unit. In another embodiment, the thermal control unit 350 is placed subsequent to the merger of the deionized water feed stream 312 and the chemical solution feed stream 322 into a single stream. Utilization of a single thermal control unit 350 allows all the constituent components of the cleaning fluid to be heated or cooled in bulk. Since all the components are heated or cooled in the same thermal control unit 350, varying the relative flow rates of the deionized water feed stream 312 and the chemical solution feed stream 322 has no or minimal effect on the temperature of the resulting mixed cleaning fluid.

In another embodiment, at least one thermal control unit 350 is disposed in each of the deionized water feed stream 312 and the chemical solution feed stream 322. Independent thermal control units 350 for each of the deionized water feed stream 312 and the chemical solution feed stream 322 provides control of the temperature of the deionized water feed stream and the chemical solution feed stream individually. If the flow rate of the deionized water feed stream 312 or the chemical solution feed stream 322 is increased or decreased the heat exchange rate of the respective thermal control unit 350 can be adjusted to compensate. Additionally, the heat exchange rate of the thermal control unit 350 can be adjusted as the inlet or feed temperature of the deionized water feed stream 312 or the chemical solution feed stream 322 varies.

The thermal control unit 350 allows adjustment of the temperature of the cleaning fluid to a desired set-point or range. In an embodiment the cleaning fluid is preferably provided at the cleaning fluid delivery channel 220 at a temperature below 100° C. Specifically, the cleaning fluid is preferably maintained below the boiling point of water at the operating pressure of the particle removal tool 100. Maintenance below the boiling point of water at the operating pressure of the particle removal tool 100 is desirable to prevent formation of undesirable bubbles within the cleaning fluid which reduces the effectiveness of the ultrasonic cleaning operation. The cleaning fluid is more preferably provided at the cleaning fluid delivery channel 220 at a temperature between approximately 20° C. and approximately 95° C. The cleaning fluid is even more preferably provided at the cleaning fluid delivery channel 220 at a temperature between approximately 20° C. and approximately 30° C. specifically in unheated applications and still even more preferably between approximately 24° C. and approximately 26° C. The cleaning fluid is more preferably provided at the cleaning fluid delivery channel 220 at a temperature between approximately 75° C. and approximately 85° C. specifically in heated applications and still even more preferably between approximately 78° C. and approximately 82° C. As smaller particles tend to have a stronger attachment force to the cleaning surface plane 280, a higher temperature cleaning fluid is desirable to remove a smaller particle than a relatively larger particle. The increased cleaning fluid temperature lowers the attractive force between the particle and the cleaning surface plane 280 to ease particle removal.

In an embodiment of the particle removal tool 100, the particle removal tool further comprises a liquid particle counter 360 in fluid communication with the cleaning fluid return channel 230 of the cleaning chamber 200. The liquid particle counter 360 detects and tabulates the particles removed from the cleaning surface plane 280. In an embodiment, the liquid particle counter 360 operates by shining a laser or other optical beam through the flow and tabulating occlusions of the laser or optical beam to achieve a quantitative reading of particles in the flow. A qualitative reading of the specific particle types in the flow may be achieved by collecting samples of the flow and analyze using commonly known laboratory techniques.

In an embodiment, throughout the cleaning fluid supply 300 and specifically the deionized water feed stream 312 and chemical solution feed stream 322, pressure relief valves 344 are utilized. The pressure relief valves 344 help alleviate over pressurization of the deionized water feed stream 312 and chemical solution feed stream 322. The pressure relief valves 344 help prevent over pressurization when the plurality of flow valves 340, control valves 342, and other valves in conjunction with cleaning fluid delivery pumps 330 are not individually adjusted for optimal flow.

Bevels, tapers, chamfers, fillets, rounding, and other corner treatments are shown throughout the disclosed drawings. These corner treatments may not be required and the present disclosure includes those unillustrated embodiments where the corner treatments are not present. Further, embodiments are envisioned in which corners and edges which are not shown with corner treatment are beveled, tapered, chamfered, filleted, rounded, or treated with another corner treatment.

It is also noted that recitations herein of "at least one" component, element, etc., should not be used to create an inference that the alternative use of the articles "a" or "an" should be limited to a single component, element, etc.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A particle removal tool configured to be moved across a surface to be cleaned comprising a sound field transducer, a cleaning chamber, and an open sealing face, wherein:
    the cleaning chamber comprises
        a cleaning fluid guiding chamber having an upper and lower portion extending from the sound field transducer down to the open sealing face,
        a cleaning fluid delivery channel on the upper portion of the chamber in fluid communication with the cleaning fluid guiding chamber, and
        a cleaning fluid return channel on the lower portion of the chamber with higher flow resistance than the cleaning fluid delivery channel and in fluid communication with the cleaning fluid guiding chamber;
    the open sealing face comprises a cleaning portal disposed contiguous with a plane formed by the open sealing face;
    the sound field transducer is disposed within a line-of-sight of the cleaning portal and generates acoustic waves with a frequency between approximately 20 kHz and approximately 2 MHz; and
    the open sealing face which can be moved across the surface to be cleaned comprises a chamber-to-surface interface seal which forms a fluid tight seal with a cleaning surface plane when the particle removal tool is compressed against the cleaning surface plane, wherein the cleaning fluid circulates down from the upper portion of the chamber to the lower portion of the chamber and across the surface to be cleaned.

2. The particle removal tool of claim 1, wherein the particle removal tool further comprises a liquid particle counter in fluid communication with the cleaning fluid return channel.

3. The particle removal tool of claim 1, wherein the cleaning fluid delivery channel is in fluid communication with a deionized water feed stream and a chemical solution feed stream.

4. The particle removal tool of claim 1, wherein the cleaning fluid guiding chamber comprises an inlet chamber and a return chamber.

5. The particle removal tool of claim 1, wherein the particle removal tool further comprises a thermal control unit to adjust the temperature of a cleaning fluid to be placed in the cleaning chamber.

6. The particle removal tool of claim 5, wherein the thermal control unit is a heater.

7. The particle removal tool of claim 1, wherein the open sealing face is disposed on an outwardly extending flange of the cleaning fluid guiding chamber.

8. The particle removal tool of claim 1, wherein the chamber-to-surface interface seal is an O-ring type seal.

9. The particle removal tool of claim 1, wherein the chamber-to-surface interface seal is a flange type seal.

10. The particle removal tool of claim 1, wherein the sound field transducer comprises an ultrasonic transducer and generates acoustic waves with a frequency between approximately 20 kHz and approximately 50 kHz.

11. The particle removal tool of claim 10, wherein the sound field transducer generates acoustic waves with a frequency of approximately 20 kHz, approximately 30 kHz, or approximately 40 kHz.

12. The particle removal tool of claim 1, wherein the sound field transducer comprises a megasonic transducer and generates acoustic waves with a frequency between approximately 0.8 MHz and approximately 1.2 MHz.

13. The particle removal tool of claim 12, wherein the sound field transducer generates acoustic waves with a frequency of approximately 1 MHz.

14. The particle removal tool of claim 1, wherein the sound field transducer generates acoustic waves at multiple frequencies.

15. The particle removal tool of claim 1, wherein the particle removal tool further comprises a cleaning fluid supply containing a cleaning fluid.

16. The particle removal tool of claim 15, wherein the cleaning fluid comprises deionized water.

17. The particle removal tool of claim 15, wherein the cleaning fluid comprises a surfactant and an oxidizing agent.

18. The particle removal tool of claim 15, wherein the cleaning fluid is provided at the cleaning fluid delivery channel at a pH between approximately 2 and approximately 12.

19. The particle removal tool of claim 15, wherein the cleaning fluid is provided at the cleaning fluid delivery channel at a temperature between approximately 20° C. and approximately 95° C.

* * * * *